United States Patent [19]

Eichelberger et al.

[11] 4,138,665
[45] Feb. 6, 1979

[54] PREAMPLIFIER FOR ANALOG TO DIGITAL CONVERTERS

[75] Inventors: Charles W. Eichelberger, Schenectady; Walter J. Butler, Scotia, both of N.Y.

[73] Assignee: General Electric Company, Schenectady, N.Y.

[21] Appl. No.: 835,068

[22] Filed: Sep. 21, 1977

[51] Int. Cl.² .......................................... H03K 13/02
[52] U.S. Cl. ...................... 340/347 NT; 307/221 D; 323/93; 330/7; 340/347 AD; 340/347 M; 357/24
[58] Field of Search .... 340/347 M, 347 AD, 347 CC; 328/147, 149, 151; 357/24; 323/93; 363/59, 60; 330/7; 307/221 R, 221 D, 221 C

[56] References Cited

U.S. PATENT DOCUMENTS

| 4,051,469 | 9/1977 | Ninomiya | 340/347 AD |
| 4,070,667 | 1/1978 | Eichelberger | 340/347 M X |

*Primary Examiner*—Thomas J. Sloyan
*Attorney, Agent, or Firm*—Geoffrey H. Krauss; Joseph T. Cohen; Marvin Snyder

[57] ABSTRACT

A preamplifier using charge transfer techniques is formed on the same chip as a charge transfer analog to digital converter. The preamplifier then couples low level output sensors directly to the converter without need for a costly interfacing amplifier.

13 Claims, 11 Drawing Figures

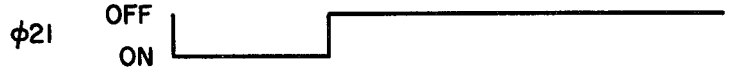
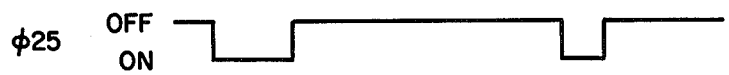
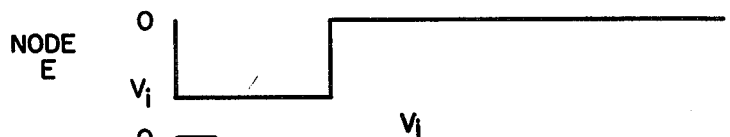
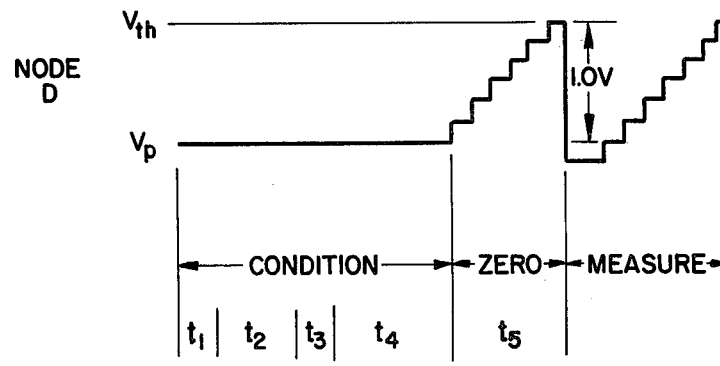

PREAMPLIFIER FOR ANALOG TO DIGITAL CONVERTERS

BACKGROUND OF THE INVENTION

This invention relates to a charge transfer analog to digital converter circuit, and more specifically relates to a novel preamplifier using charge transfer techniques to permit the connection of a low output level sensor, such as a thermocouple, to an analog to digital converter circuit of the charge transfer type.

Control systems are well known, wherein the output of a sensor, such as a thermocouple is used as an input to the circuit. Such control systems may be used to control the operation of an appliance, and rugged and inexpensive thermocouples are used for this purpose. The drawback of such systems is that the thermocouple (or other sensor) produces a low level output signal which cannot accurately be converted by standard analog to digital converters without expensive preamplification. Particularly, when such signals are applied to standard analog to digital converters, the resultant output has a very low resolution. To overcome this problem, prior art control systems utilize stable, high gain d-c amplifiers to preamplify the sensor output before application to the analog to digital converter. Due to the stability and linearity requirements, prior art MOS amplifiers are unsuitable and the amplifier was usually formed using discrete and costly devices.

BRIEF SUMMARY OF THE INVENTION

The present invention overcomes the foregoing problems by providing a novel voltage amplifier which is based on a charge transfer mode of operation. Significantly, the amplifier is insensitive to MOSFET threshold voltage change or parameter variations, and therefore exhibits sufficient stability characteristics to permit its use as a preamplifying stage for an analog to digital converters. Accordingly, the novel circuit of the invention can serve as a preamplifier to allow a low level sensor, such as a thermocouple, to be directly coupled to a charge transfer analog to digital converter which is implemented on the same chip as the preamplifier.

In the preferred embodiment, the preamplifier of the present invention includes two capacitors having magnitudes of C and kC picofarads, respectively, separated by a MOSFET transistor biased to operate in the "shelf" transistor mode. Such a transistor conducts whenever its source voltage is greater than its gate voltage less its threshold voltage and automatically cuts off when its source voltage reduces to this value.

During a first time period, the larger capacitor is precharged to a value $V_g - V_{TS}$ where $V_g$ is the gate voltage of the transistor and $V_{TS}$ is the threshold voltage thereof. As a result, the shelf transistor will be off. During a second time interval, the relatively low output voltage $V_i$ of a sensor (thermocouple) is connected to the bottom of the larger capacitor (kC). This change in voltage causes the transistor to conduct and to transfer a charge packet $q_i$ from the larger to the smaller capacitor. The magnitude of the charge packet $q_i$ is $kCV_i$ so that the voltage across the smaller capacitor (C) changes by an amount $kV_i$. As a result of the foregoing, the voltage across the second capacitor has increased by a magnitude representative of the output of the thermocouple magnified by the value k. By properly choosing the ratio between the larger and smaller capacitors, it is possible to provide a highly stable MOSFET amplifier circuit suitable for use as a preamplifier for an analog to digital converter.

Since the novel preamplifier circuit can be fabricated with MOSFET devices, the circuit can be formed on the same chip as an MOSFET type charge transfer analog to digital converter, which may be of the type shown in U.S. patent application Ser. No. 628,542, filed Nov. 3, 1975, now abandoned and superseded by continuation application Ser. No. 853,115, filed Nov. 21, 1977 and both assigned to the assignee of the present invention.

BRIEF DESCRIPTION OF THE DRAWINGS

FIGS. 2a to 2e are timing diagrams showing the switching of various transistors of FIG. 1 and FIGS. 2f to 2j show the potentials at various nodes in FIG. 1, where all of FIGS. 2a to 2j are plotted on a common time scale.

DETAILED DESCRIPTION OF THE DRAWINGS

Figure 1:
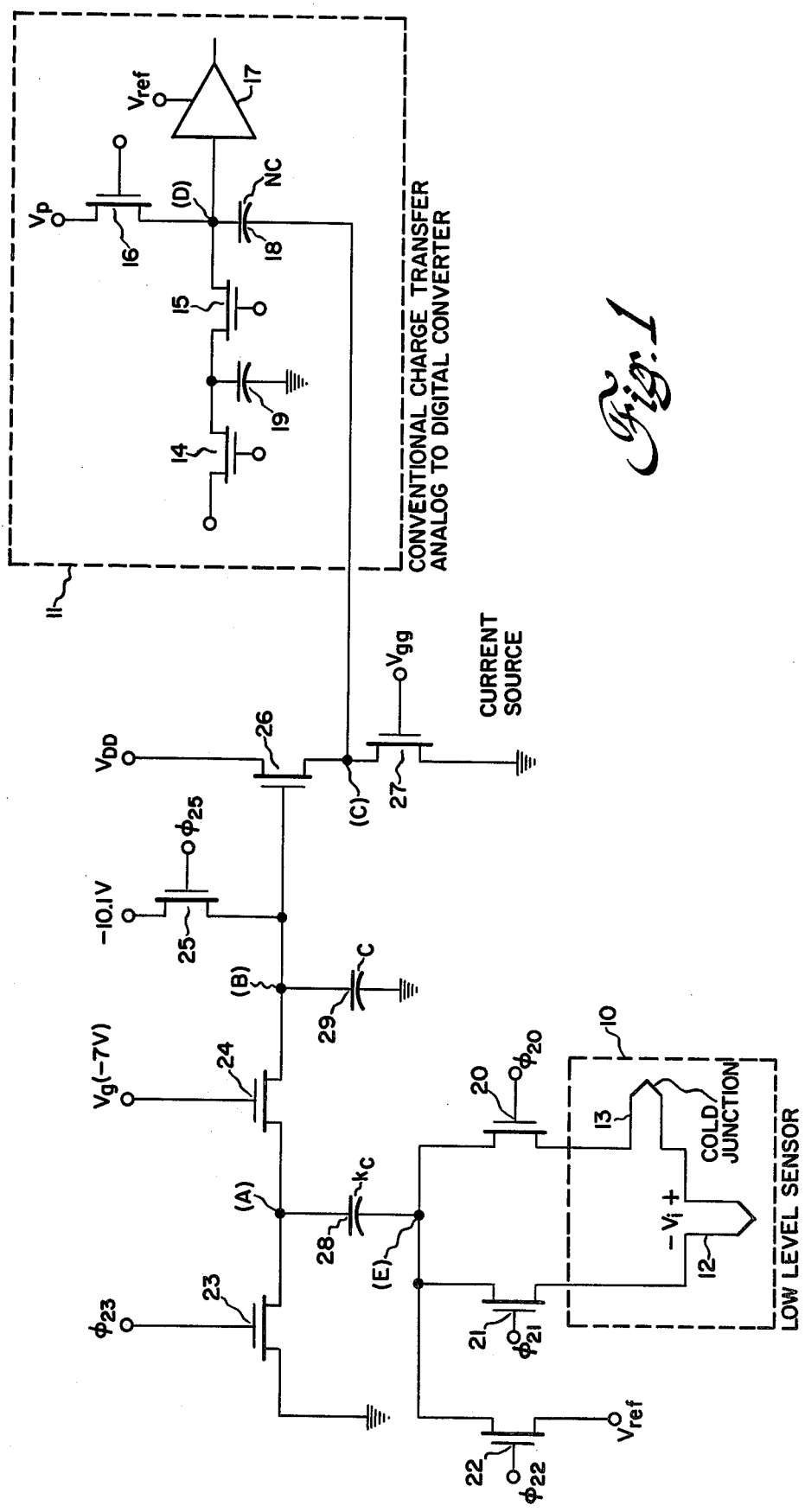
FIG. 1 is a circuit diagram of the novel circuit of the invention wherein the circuit drives a conventional charge transfer analog to digital converter where all transistors are MOSFET type devices which can be implemented on a common chip.

Referring first to FIG. 1, the novel circuit of the invention is used to directly couple the low level sensor 10 to a conventional charge transfer analog to digital converter 11 which will have a high resolution, for example six to eight bits, even though the low level sensor output 10 has a very small output, for example, 10 millivolts. Thus, in the control of a domestic appliance, or the like, a thermocouple may be used to monitor the device conditions, and, depending on its output, certain contact functions are caused to take place. The present invention provides a novel circuit to enable the output of sensor 10 to be preamplified to a sufficiently high level to enable the analog to digital converter 11 to operate with the necessary resolution. Moreover, the devices of the invention may be fabricated with MOSFET devices, and may be formed on the same chip as one which may contain the analog to digital converter 11.

Low level sensor 10 may be, by way of example, an E, J or K thermocouple having a hot junction 12 and a cold junction 13. A low level analog d-c output signal having the polarity shown is developed across junction 12 responsive to a temperature difference between junctions 12 and 13.

The analog to digital converter 11 consists of MOSFET transistors 14, 15 and 16, and a Schmidt trigger 17, which control the metering of charge packets from capacitor 18 to capacitor 19. This circuit converts the analog voltage connected to capacitor 18 to a number of discrete charge packets which are sequentially transferred from capacitor 19 into capacitor 18 until Schmidt trigger 17 is operated. The operation of circuit 11 is well known, and is described, for example, in U.S. patent application Ser. No. 628,542, filed Nov. 3, 1975, abandoned and now superseded by continuation application Ser. No. 853,115, filed Nov. 21, 1977, and both assigned to the assignee of the present application.

The preamplifier circuit of the invention includes transistor switches 20 through 27, which all may be MOSFET devices. These devices are used to couple capacitors 28 and 29 in a manner which changes the voltage on capacitor 29 by a factor of k times the change of the voltage on capacitor 28 where k is the ratio of the capacitance of capacitors 28 and 29. Capacitor 29 has a capacitance C and capacitor 28 has a capacitance of kC, where k typically can be from 10 to 200. Capacitor 29, typically can be 1.0 picofarad, capacitor 28 can be 100 picofarad, capacitor 18 can be 20 picofarads, and capacitor 19 can be 0.2 picofarads.

Transistor 22, as will be later described, is connected to a reference voltage $V_{REF}$ and operates to automatically scale the size of the charge packet delivered to capacitor 18 to give a desired output count.

Transistor 27 has its gate connected to a voltage $V_{gg}$ and is connected in series with source follower 26 which has a source voltage $V_{DD}$ which may be, for example, $-20$ volts. Transistor 27 then functions as a current source or fixed resistor so that the voltage at node D follows the voltage at node B which is connected to the gate of transistor 26.

Transistor 25 is connected to node B and its drain is connected to a fixed voltage, for example, $-10.1$ volts, which is substantially more negative than the gate voltage of transistor 24. Transistor 24 has a fixed gate voltage which may be, for example, $-7$ volts, and transistor 24 operates in the mode of a "shelf" voltage transistor, or a transistor which conducts until its source to drain voltage reaches a negative value of the gate voltage $V_g$ minus the threshold voltage $V_{TS}$. That is, it operates in a source cutoff mode.

The operation of the circuit of FIG. 1 is now described with reference to the timing and voltage diagrams of FIGS. 2a to 2j. In these diagrams, the circuit operation is described for four different time intervals $t_1$ to $t_4$ in a "condition" interval, in which a voltage $kV_i$ is applied across capacitor 29, where $V_i$ is the low level sensor input voltage at junction 12. This is followed by a "zeroing" interval in which the node D of circuit 11 is precharged to the voltage $V_p$ of the source of transistor 16 and the bottom of capacitor 18 goes negative by an amount $kV_i$, which is to be converted to a digital signal. Finally, in a "measure" interval, the charge transfer circuit 11 converts the voltage $kV_1$ to a digital output.

At the beginning of the condition interval, and at the beginning of interval $t_1$, transistor 20 is off, transistor 21 is turned on, transistor 23 is turned on, and transistor 25 is off. The gate of transistor 24 is at $-7$ volts so that during $t_1$ transistor 24 is on. Consequently, the node E is connected to the negative thermocouple terminal, and is at $-V_i$ and node A is at zero volts or ground. Since transistor 24 is on, node B is at zero volts and node C is also at zero volts.

At the beginning of time $t_2$, transistor 25 turns on, and node B is precharged to $-10.1$ volts. Note that any other appropriate voltage could have been selected for the drain voltage of transistor 25, and that circuit operation is not dependent on the exact value of the voltage (or of the gate voltage of transistor 24). Transistor 24 continues to conduct during interval $t_2$, so that node A charges toward the turnoff voltage $-(V_g - V_{TS})$ of transistor 24 where $V_g$ is its gate voltage and $V_{TS}$ is its threshold voltage. Shelf transistor 24 is turned off before the end of interval $t_2$, and node A is fixed at the voltage $V_A = -(V_g - V_{TS})$.

At the beginning of interval $t_3$, transistor 25 is turned off and the node B will float at a voltage of about $-10.0$ volts. The voltage at node B is monitored by source follower transistor 26 which generates an output voltage at node C which is connected to the bottom of storage capacitor 18.

The circuit is now preconditioned, whereby the voltage at node A can be changed by an amount equal to the signal voltage $V_i$. Thus, at the beginning of interval $T_4$, transistors 20 and 21 change state; that is, transistor 20 turns on and transistor 21 turns off. Consequently, the voltage at node E changes from $-V_i$ to $-0$ volts. This causes node A to go in a positive direction by the input voltage $V_i$. The increase in voltage at node A causes transistor 24 to begin to conduct. Charge keeps flowing from node A to node B until the voltage of node A returns to $(-V_g - V_{TS})$ and, as shown in FIG. 2h, the voltage of node B is increased by an amount $kV_i$. Transistor 24 continues to conduct, until its source voltage i.e., the voltage at node A, once again reches $-(V_g - V_{TS})$, and a charge packet $q_i$ is transferred from node A to node B. The size of charge packet $q_i$ is given by $$q_i = kCV_i$$

so that the voltage at node B (and thus at node C) changes by an amount $$V_B = q_i/C = kV_i$$

Thus, if k is 100 and $V_i$ is 10 millivolts, the voltage at nodes B and C change positively by 1.0 volts, to about $-9.0$ volts at node B and $-6$ volts at node C. Therefore, the input signal $V_i$ has been amplified by the ratio of the values of capacitances 28 and 29 at nodes A and B, and the amplification is independent of the device threshold characteristics. As a result, the analog signal voltage can now be more easily resolved into digital values in the analog to digital converter 11.

The preamplified voltage at node C is connected to the bottom of storage capacitor 18, and this analog voltage is then converted into a digital signal by the converter 11 in the usual manner. Thus, interval 5 is the usual "zero" period during which node D is precharged to the voltage source $V_p$ of transistor 16. Then, transistors 14 and 15 are operated to transfer packets of charge from capacitor 19 to capacitor 18 until the threshold voltage of Schmidt trigger 17 is reached.

Once the zero interval $t_5$ is ended and node D is at the Schmidt trigger cutoff level, the "measure" interval begins. Transistor 25 is first turned on, causing node B to charge to $-10.1$ volts. Transistor 25 is then turned off causing node B to go to $-10.0$ volts. At this point, the bottom of capacitor 18 has gone in a negative direction by the measured amount $kV_i$ volts, and the measurement then proceeds in the usual manner, producing a digital output related to the analog voltage $kV_i$.

Once the measure operation is completed, the circuit is returned to the condition of the beginning of interval $t_1$.

Transistor 22 is useful in the circuit for scaling purposes. For example, if the thermocouple response is linear, it might be desired to scale the circuit output reading directly in degrees Centigrade or degrees Fahrenheit. Transistor 22 connects a reference voltage $V_{REF}$ to node E so that the size of metered charge packets delivered by transistor 15 to capacitor 18 can automatically be sealed to give the desired output count for the selected type readout desired for sensor 10.

As previously noted, the present invention may be implemented by MOSFET devices formed on the same chip as the converter 11. Clearly, however, the novel preamplifier could also be implemented by all discrete devices, or of partly discrete devices.

Although a preferred embodiment of this invention has been described, many variations and modifications will now be apparent to those skilled in the art, and it is therefore preferred that the instant invention be limited not by the specific disclosure herein but only by the appended claims.

What we claim is:

1. An amplifier circuit comprising, in combination:
   a first capacitor having a capacitance C;
   a second capacitor having a capacitance kC;
   input circuit means including a pair of switching transistors for sequentially connecting the opposite polarities of an input signal to said second capacitor to change the voltage applied to said second capacitor by an input voltage $V_i$;
   output circuit means connected to said first capacitor; and
   charge transfer transistor circuit means for transferring charge from said second capacitor to said first capacitor to produce an output voltage $kV_i$ on said output circuit means in response to a change of voltage $V_i$ on said second capacitor, and including a transistor adapted to operate in a "shelf" mode and connected between said first and second capacitors, whereby said charge transfer transistor circuit means becomes conducting when the voltage across said second capacitor changes by $V_i$ to transfer a charge packet having a magnitude $q_i = kCV_i$ to said first capacitor to increase the voltage across said first capacitor by $kV_i$.

2. The circuit of claim 1, wherein k is greater than 1.

3. The circuit of claim 1, wherein said transistor circuit means consists of MOSFET-type transistors.

4. The circuit of claim 1, which further includes a second switching transistor means for connecting one terminal of said second capacitor to zero potential.

5. The circuit of claim 4, wherein k is substantially greater than 1.

6. The circuit of claim 5, wherein all of said transistors are of the MOSFET type.

7. An analog to digital converter for use with a low level sensor which produces a relatively low analog output signal voltage $V_i$, said analog to digital converter comprising:
   charge-transfer means for converting an analog signal at an analog input circuit to a digital representative of said analog signal at a digital output circuit; and
   a preamplifier connected between said low level sensor and said analog input circuit to sufficiently preamplify said analog output signal voltage to produce a desired bit resolution from said digital output circuit; said preamplifier circuit comprising, in combination:
   a first capacitor having a capacitance C;
   a second capacitor having a capacitance kC;
   first means comprising a pair of switching transistors each connected between a first terminal of said second capacitor and a different side of the output of said low voltage sensor for connecting said output voltage $V_i$ to said second capacitor to change the voltage across said second capacitor by said voltage $V_i$;
   transistor switching means for connecting said first capacitor to said second capacitor to permit current to flow between said first and second capacitors when said switching transistor means is conducting and causing, after the voltage across said second capacitor is changed by $V_i$, a charge packet $q_i - kCV_i$ to be transferred to said first capacitor to increase the voltage across said first capacitor by $kV_i$; and
   second means for connecting the voltage across said first capacitor to said analog input circuit of said charge transfer converting means.

8. The circuit of claim 7, wherein k is greater than 1.

9. The circuit of claim 7, wherein k is in the range of from about 10 to about 200.

10. The circuit of claim 7, wherein said transistor switching means is a shelf transistor having a fixed negative gate voltage and which further includes second transistor switching means connected to said first transistor and to said first capacitor for applying a biasing voltage to said first transistor means.

11. The circuit of claim 7, which further includes a scaling transistor switching circuit means connected to said second capacitor for changing the scale of the digital output signal voltage $V_i$.

12. The circuit of claim 7, wherein said preamplifier and said change transfer analog to digital converting means include MOSFET transistors formed on a common chip.

13. The circuit of claim 7, wherein said second means includes source follower transistor circuit means.

* * * * *